(12) United States Patent
Wang et al.

(10) Patent No.: US 11,790,691 B2
(45) Date of Patent: Oct. 17, 2023

(54) FINGERPRINT IDENTIFICATION SENSOR, DISPLAY SUBSTRATE, DISPLAY DEVICE AND FINGERPRINT IDENTIFICATION METHOD

(71) Applicant: BOE TECHNOLOGY GROUP CO., LTD., Beijing (CN)

(72) Inventors: Lei Wang, Beijing (CN); Haisheng Wang, Beijing (CN); Xiaoliang Ding, Beijing (CN); Lin Zhang, Beijing (CN); Yingming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 485 days.

(21) Appl. No.: 17/044,203

(22) PCT Filed: Nov. 18, 2019

(86) PCT No.: PCT/CN2019/119164
§ 371 (c)(1),
(2) Date: Sep. 30, 2020

(87) PCT Pub. No.: WO2021/097607
PCT Pub. Date: May 27, 2021

(65) Prior Publication Data
US 2023/0109429 A1   Apr. 6, 2023

(51) Int. Cl.
*G06V 40/13*   (2022.01)
*G06V 40/12*   (2022.01)

(52) U.S. Cl.
CPC .................................. *G06V 40/1359* (2022.01)

(58) Field of Classification Search
None
See application file for complete search history.

(56) References Cited

U.S. PATENT DOCUMENTS

| 2010/0148068 A1 | 6/2010 | Schwaneberg et al. |
| 2018/0005005 A1* | 1/2018 | He ..................... G06F 3/0418 |
| 2018/0151639 A1 | 5/2018 | Luo et al. |
| 2018/0165496 A1* | 6/2018 | Cheng ..................... G09F 9/00 |
| 2020/0031182 A1* | 1/2020 | Lee ..................... F21S 43/14 |
| 2020/0193120 A1* | 6/2020 | Chen ..................... H10K 59/60 |
| 2021/0073505 A1 | 3/2021 | Ye |

FOREIGN PATENT DOCUMENTS

| CN | 106169074 A | 11/2016 |
| CN | 108121939 A | 6/2018 |
| CN | 108256409 A | 7/2018 |
| CN | 108875622 A | 11/2018 |
| CN | 109716353 A | 5/2019 |
| JP | H0962828 A | 3/1997 |
| WO | 2019080652 A1 | 5/2019 |

OTHER PUBLICATIONS

China National Intellectual Property Administration. Chinese Notification of Office Action dated Dec. 19, 2022. in Chinese Patent Application No. 201980002463.2 in Chinese Language with English Language Translation. 14 pages.

* cited by examiner

*Primary Examiner* — Joseph R Haley
(74) *Attorney, Agent, or Firm* — Procopio, Cory, Hargreaves & Savitch LLP

(57) ABSTRACT

A fingerprint identification sensor includes a base, and at least one light sensing unit disposed on the base. The at least one light sensing unit is configured to collect at least two different monochromatic lights of light reflected by a finger to identify a fingerprint.

16 Claims, 12 Drawing Sheets

FINGERPRINT IDENTIFICATION SENSOR, DISPLAY SUBSTRATE, DISPLAY DEVICE AND FINGERPRINT IDENTIFICATION METHOD

CROSS-REFERENCE TO RELATED APPLICATIONS

This application is a national phase entry under 35 USC 371 of International Patent Application No. PCT/CN2018/119164 filed on Nov. 18, 2019, which is incorporated herein by reference in its entirety.

TECHNICAL FIELD

The present disclosure relates to the field of display technologies, and in particular, to a fingerprint identification sensor, a display substrate, a display device and a fingerprint identification method.

BACKGROUND

With the development of science and technology, fingerprint identification sensors are more and more widely used in daily life. According to the principle of fingerprint imaging, fingerprint identification sensors can be classified into optical sensors, semiconductor capacitive sensors, semiconductor thermal sensors, semiconductor pressure-sensitive sensors, ultrasonic sensors, etc.

SUMMARY

In one aspect, a fingerprint identification sensor is provided. The fingerprint identification sensor includes a base, and at least one light sensing unit disposed on the base. The at least one light sensing unit is configured to collect at least two different monochromatic lights of light reflected by a finger to identify a fingerprint.

In some embodiments, the fingerprint identification sensor further includes at least one point light source disposed on the base. The at least one point light source is configured to provide the finger with polychromatic light that is a composition of at the least two monochromatic lights of different wavelengths.

In some embodiments, each of the at least one light sensing unit includes at least two light sensing sub-units. The at least two light sensing sub-units are capable of collecting the at least two different monochromatic lights in a one-to-one correspondence manner.

In some embodiments, each of the at least two light sensing sub-units includes: a photosensitive diode, a thin film transistor electrically connected to the photosensitive diode, and a filter portion disposed on a light incident side of the photosensitive diode. Optical signals allowed to be transmitted by filter portions of different light sensing sub-units in a same light sensing unit are of different wavelength ranges.

In some embodiments, the filter portion includes a color resist layer. Color resist layers of different light sensing sub-units in a same light sensing unit have different colors.

In some embodiments, the colors of the color resist layers of the different light sensing sub-units in the same light sensing unit include at least red and green.

In another aspect, a display substrate is provided. The display substrate includes the fingerprint identification sensor as described in some above embodiments, and a pixel layer disposed on a light incident side of the at least one light sensing unit.

In some embodiments, the display substrate is an organic light-emitting diode substrate. The pixel layer includes a plurality of pixels. The fingerprint identification sensor includes at least one point light source, at least one of the plurality of pixels is the at least one point light source.

In yet another aspect, a display device is provided. The display device includes the display substrate as described in some above embodiments.

In yet another aspect, a fingerprint identification method is provided. The fingerprint identification method includes: collecting at least two different monochromatic lights of light reflected by a finger; and determining whether the light reflected by a finger is imaging light of valleys in a fingerprint or imaging light of ridges in the fingerprint according to a difference between signal intensities of any two of the at least two different monochromatic lights.

In some embodiments, determining whether the light reflected by a finger is the imaging light of the valleys in the fingerprint or the imaging light of the ridges in the fingerprint according to the difference between the signal intensities of any two of the at least two different monochromatic lights, includes: determining whether an absolute value of the difference is less than a first threshold value; if yes, determining that the light reflected by a finger is the imaging light of the ridges in the fingerprint; and if no, determining that the light reflected by a finger is the imaging light of the valleys in the fingerprint.

In some other embodiments, determining whether the light reflected by a finger is the imaging light of the valleys in the fingerprint or the imaging light of the ridges in the fingerprint according to the difference of signal intensities of the spectral lines of any two monochromatic lights in the spectral lines of the at least two different monochromatic lights, includes: determining whether the absolute value of the difference is less than a second threshold value or greater than a third threshold value; if the absolute value of the difference is less than the second threshold value, determining that the light reflected by a finger is the imaging light of the ridges in the fingerprint; and if the absolute value of the difference is greater than the third threshold value, determining that the light reflected by a finger is the imaging light of the valleys in the fingerprint. The second threshold value is less than the third threshold value.

In some embodiments, the fingerprint identification method further includes: acquiring light intensity of the light reflected by a finger when the at least two different monochromatic lights are collected. Determining whether the light reflected by a finger is the imaging light of the valleys in the fingerprint or the imaging light of the ridges in the fingerprint according to the difference of the signal intensities of any two of the at least two different monochromatic lights, further includes: determining whether the light reflected by a finger is the imaging light of the valleys in the fingerprint or the imaging light of the ridges in the fingerprint according to the difference between the signal intensities of any two of the at least two different monochromatic lights and the light intensity of the light reflected by a finger.

In some embodiments, the fingerprint identification method further includes: determining whether the light reflected by a finger is light reflected by a real finger or light reflected by a fake finger according to the difference between the signal intensities of any two of the at least two different monochromatic lights.

In some embodiments, the at least one light sensing unit is configured to collect at least green light and red light of light reflected by a finger.

In some embodiments, the at least one light sensing unit is further configured to collect blue light of light reflected by a finger.

In some embodiments, the at least one light sensing unit includes a plurality of light sensing units that are arranged in an array; and the fingerprint identification sensor further includes: a plurality of gate lines, a plurality of data lines, a gate driver circuit and a data processing circuit. A gate of a thin film transistor of each light sensing sub-unit in each row of light sensing sub-units is electrically connected to the gate driver circuit through a gate line. A first electrode of a thin film transistor of each light sensing sub-unit in each column of light sensing sub-units is electrically connected to the data processing circuit through a data line, and a second electrode of the thin film transistor is electrically connected to an anode of the first photosensitive diode. The data processing circuit is configured to receive electric signals representing the at least two different monochromatic lights output by the at least two light sensing sub-units to the data processing circuit through corresponding data lines for data-processing.

In some embodiments, the colors of the color resist layers of the different light sensing sub-units in the same light sensing unit further include blue.

BRIEF DESCRIPTION OF THE DRAWINGS

In order to describe technical solutions in some embodiments of the present disclosure more clearly, the accompanying drawings to be used in some embodiments of the present disclosure will be introduced briefly. Obviously, the accompanying drawings to be described below are merely some embodiments of the present disclosure, and a person of ordinary skill in the art can obtain other drawings according to these drawings.

DETAILED DESCRIPTION

The technical solutions in embodiments of the present disclosure will be described clearly and completely in combination with the accompanying drawings in some embodiments of the present disclosure. Obviously, the described embodiments are merely some but not all of the embodiments of the present disclosure. All other embodiments made on the basis of the embodiments of the present disclosure by a person of ordinary skill in the art shall be included in the protection scope of the present disclosure.

Optical fingerprint identification sensors, especially under-screen optical fingerprint identification sensors, mainly obtain a fingerprint texture through reflected optical signals obtained after light is irradiated to a finger (i.e., light reflected by a finger).

Figure 1:
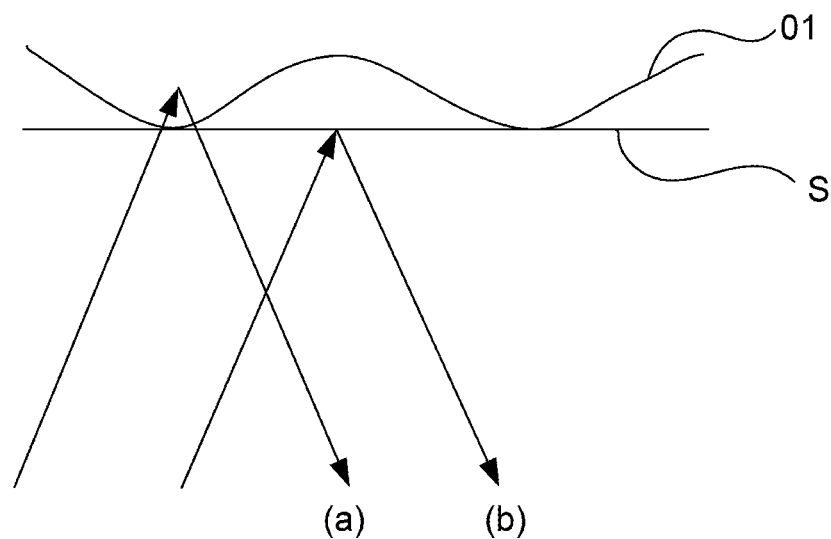
FIG. 1 is a schematic diagram of a fingerprint collection principle, according to some embodiments of the present disclosure.
Figure 2:
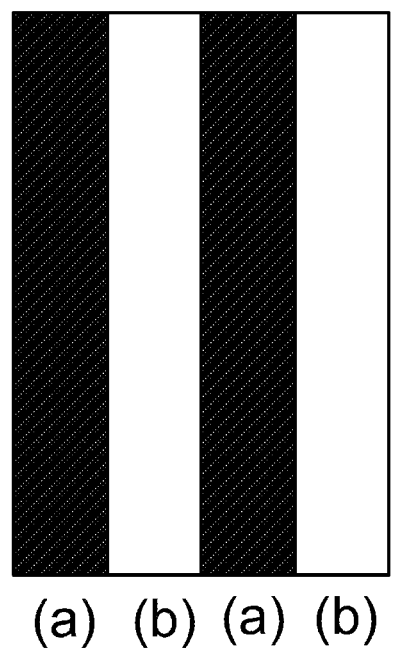
FIG. 2 is a schematic diagram of a fingerprint image obtained according to the fingerprint collection principle shown in FIG. 1.

In some embodiments of the present disclosure, referring to FIG. 1, after light is irradiated to a finger 01, different reflected light can be obtained. Here, light reflected by ridges (a) is light reflected by ridges in a fingerprint of the finger 01, light reflected by valleys (b) is light reflected by valleys in the fingerprint of the finger 01, and light intensity of the light reflected by ridges (a) is different from light intensity of the light reflected by valleys (b). After the fingerprint identification sensor collects the light reflected by ridges (a) and the light reflected by valleys (b), an alternately bright and dark fingerprint image as shown in FIG. 2 may be formed according to the light reflected by ridges (a) and the light reflected by valleys (b).

It will be added that, with continued reference to FIG. 1, in a case where the finger 01 is in contact with the fingerprint identification sensor, the ridges in the fingerprint of the finger 01 are in direct contact with a surface of the fingerprint identification sensor, while there is air between the valleys in the fingerprint of the finger 01 and the surface of the fingerprint identification sensor. Therefore, light first irradiated to the ridges in the fingerprint of the finger passes through the fingerprint identification sensor and enters the finger, and then is reflected or scattered back into the fingerprint identification sensor. And light irradiated to the valleys in the fingerprint of the finger is reflected back into the fingerprint identification sensor by the surface of the fingerprint identification sensor that is in contact with the air.

On a basis of optical characteristics of human skin, after light enters the finger, human pigment in the finger is able to selectively absorb the light. That is, the human pigment in the finger is able to change the spectrum of the light irradiated to the ridges in the fingerprint of the finger. The spectrum refers to a pattern in which dispersed monochromatic light is sequentially arranged according to a magnitude of wavelength (or frequency) after light is split by a dispersion system (such as a prism or a grating), and a full name thereof is optical spectrum.

Figure 3:
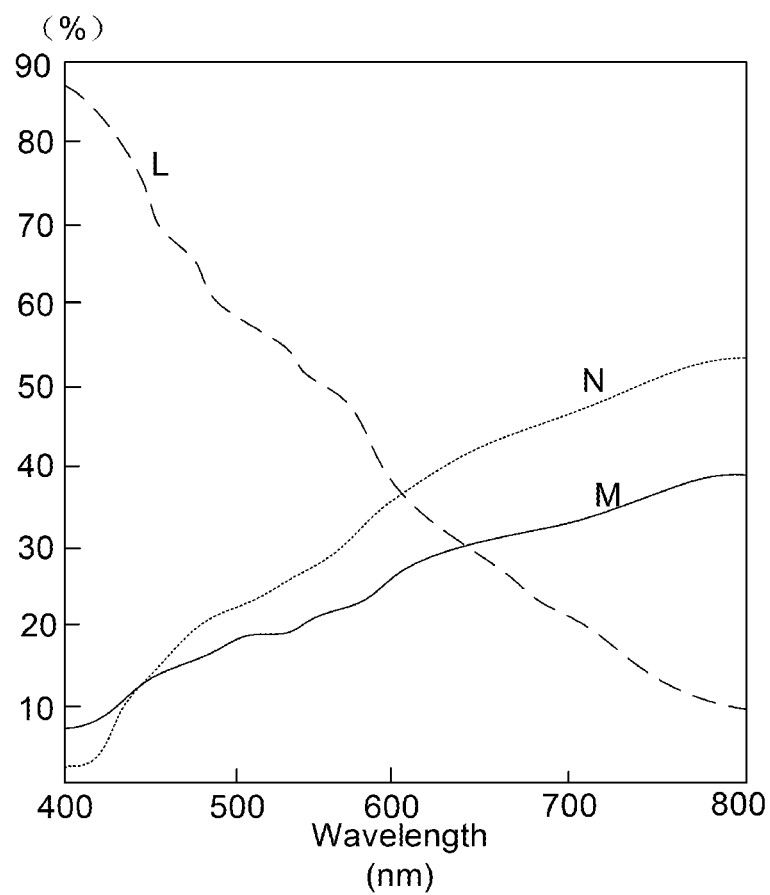
FIG. 3 is a diagram of optical properties of skin, according to some embodiments of the present disclosure.

For example, the optical characteristics of human skin are as shown in FIG. 3, and a curve M is configured to represent a reflectivity of human skin to light, a curve N is configured to represent a transmission ratio of human skin to light, and a curve L is configured to represent an absorptance of human skin to light. As a result, compared with spectral lines of light that is initially irradiated to the ridges in the fingerprint of the finger, spectral lines of the light reflected by ridges (b) that are able to be collected by the fingerprint identification sensor change. Of course, the light irradiated to the valleys in the fingerprint of the finger does not enter the finger, and thus spectral lines of the light reflected by valleys (a) that are able to be collected by the fingerprint identification sensor do not change, compared with light that is initially irradiated to the valleys in the fingerprint of the finger.

Figure 10:
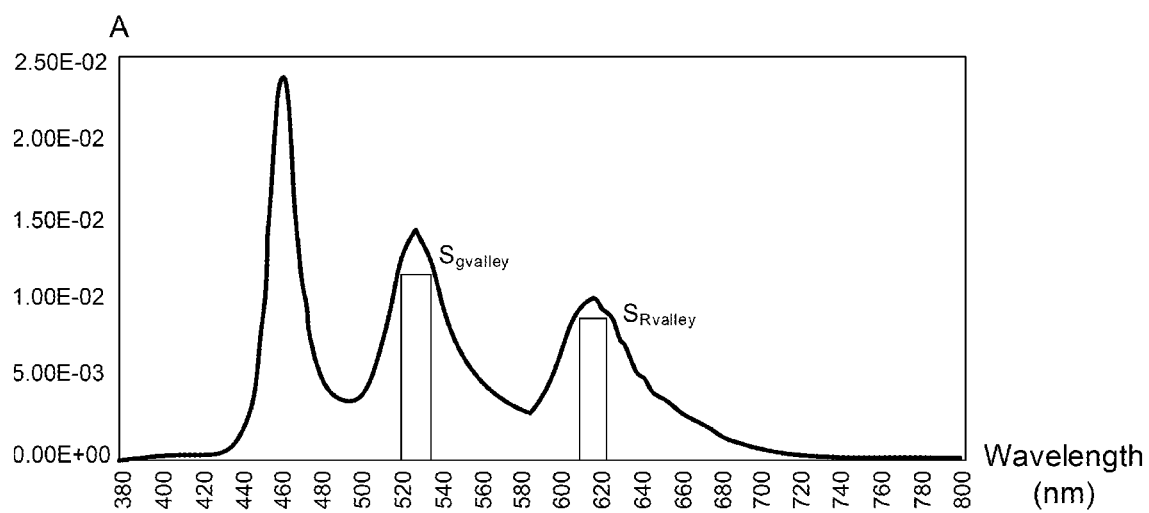
FIG. 10 is a schematic diagram of a spectrum of light reflected by valleys in light reflected by a finger, according to some embodiments of the present disclosure.
Figure 11:
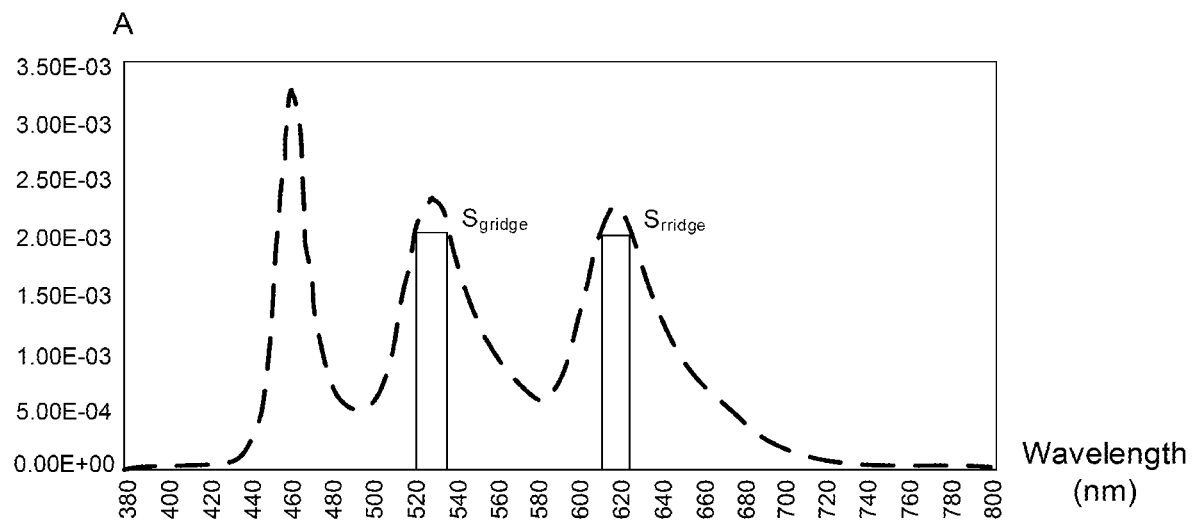
FIG. 11 is a schematic diagram of a spectrum of light reflected by ridges in light reflected by a finger, according to some embodiments of the present disclosure.

After the light reflected by a finger is effectively collected, by performing an accurate spectral analysis on the light reflected by a finger, it may be determined that a spectrum of the light reflected by valleys in the light reflected by a finger is generally as shown in FIG. 10, and a spectrum of the light reflected by ridges in the light reflected by a finger is generally as shown in FIG. 11. Herein, the spectral analysis of the light reflected by a finger may be performed by a spectral analyzer in the related art, and analysis accuracy thereof is related to a corresponding structure of the spectral analyzer.

It will be seen that the light reflected by valleys (a) and the light reflected by ridges (b) in the light reflected by a finger have different spectral lines.

Figure 4:
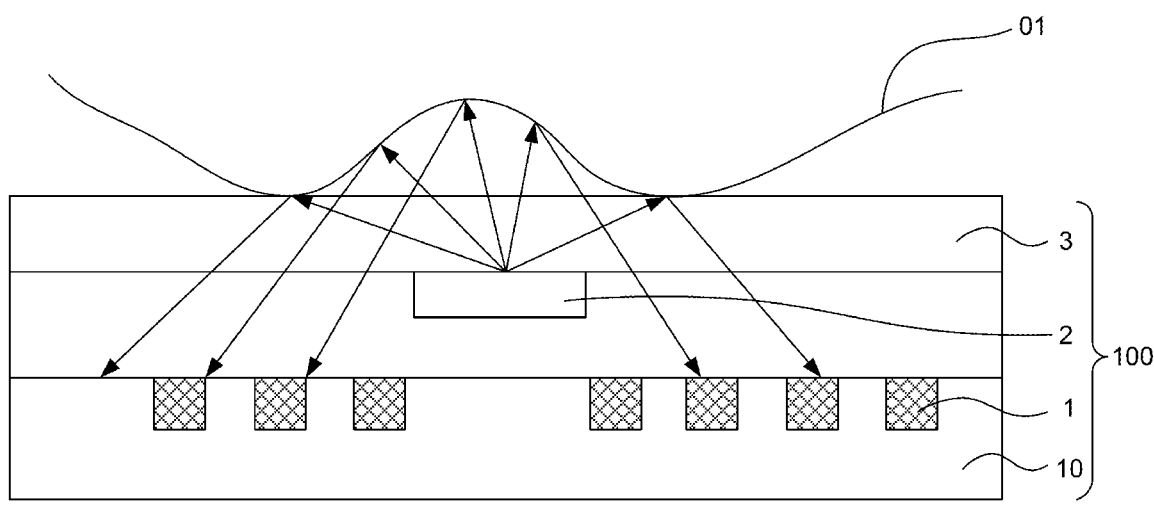
FIG. 4 is a schematic diagram of a structure of a fingerprint identification sensor, according to some embodiments of the present disclosure.

On this basis, some embodiments of the present disclosure provide a fingerprint identification sensor. Referring to FIG. 4, the fingerprint identification sensor 100 includes a base 10 and at least one light sensing unit 1 disposed on the base 10. The at least one light sensing unit is configured to collect at least two different monochromatic lights in the light reflected by a finger, so as to identify a fingerprint.

The base 10 serves as a carrier of the light sensing unit 1, and the base 10 may be a rigid base or a flexible base. For example, the base 10 is a glass substrate.

The number and a structure of the light sensing units 1 may be selectively set according to actual needs, as long as the light sensing unit 1 is able to collect the at least two different monochromatic lights in the light reflected by a finger. Herein, the light sensing unit 1 is able to collect the at least two different monochromatic lights in the light reflected by a finger, which means that the light sensing unit 1 is able to respectively output electric signals configured to represent corresponding monochromatic lights, according to the at least two different monochromatic lights in the light reflected by a finger.

In this way, after the light sensing unit 1 is utilized to collect the at least two different monochromatic lights in the light reflected by a finger, according to a difference between signal intensities (the signal intensity is a read value of an electric current or electric quantity obtained after the light sensing unit 1 performs a photoelectric conversion on corresponding light, and can generally represent light intensity, e.g., the absorbance) of any two monochromatic lights in the spectral lines of the at least two different monochromatic lights, it may be accurately determined whether the light reflected by a finger is imaging light of the valleys (i.e., the light reflected by valleys) in the fingerprint or imaging light of the ridges (i.e., the light reflected by ridges) in the fingerprint, so that the fingerprint identification accuracy and reliability during the use of the fingerprint identification sensor are improved.

In addition, a fingerprint identification principle of the fingerprint identification sensor 100 is based on the optical characteristics of human skin. As a result, compared with a fingerprint sleeve made of materials such as silica gel, the finger has a characteristic of selectively absorbing light incident to the finger, and light formed through being reflected by the finger and light formed through being reflected by the fingerprint sleeve have significantly different spectra. Therefore, in a process of identifying the fingerprint by using the fingerprint identification sensor 100, according to the two monochromatic lights in the light reflected by a finger, it may be determined whether the light reflected by a finger is light reflected by a real finger (i.e., light directly reflected by a user's finger) or light reflected by a fake finger (i.e., light reflected by an object having an imitated fingerprint, such as the fingerprint sleeve), thereby reducing potential security risks in the process of identifying the fingerprint, and effectively improving security during the use of the fingerprint identification sensor 100.

Moreover, by utilizing each light sensing unit 1 in the fingerprint identification sensor 100, light intensity of the light reflected by a finger may be also acquired simultaneously when the at least two different monochromatic lights in the light reflected by a finger are collected, so that it is determined whether the light reflected by a finger is the imaging light of the valleys in the fingerprint or the imaging light of the ridges in the fingerprint according to the difference between the signal intensities of any two of the at least two different monochromatic lights and the light intensity of the light reflected by a finger. In this way, a method of identifying the fingerprint according to the two monochromatic lights in the light reflected by a finger and a method of identifying the fingerprint according to the light intensity of the light reflected by a finger may be combined, so as to obtain a fingerprint image with a high contrast between light and dark, thereby further improving the fingerprint identification accuracy, the reliability and safety during the use of the fingerprint identification sensor.

Of course, the light reflected by a finger is generally polychromatic light. That is, light irradiated to the finger should be composite light including at least two monochromatic lights of different wavelengths, e.g., white light. Herein, the light irradiated to the finger may be provided by an external light source or a built-in light source of the fingerprint identification sensor 100.

In some embodiments, with continued reference to FIG. 4, the fingerprint identification sensor 100 further includes: at least one point light source 2 disposed on the base 10, and the at least one point light source 2 is configured to provide the finger 01 with the polychromatic light synthesized by the at least two monochromatic lights of different wavelengths.

Optionally, the point light source 2 is a white organic light-emitting diode (WOLED), a white light-emitting diode (W-LED), or the like.

Some embodiments of the present disclosure do not limit a position at which the point light source 2 are provided on the base 10. Optionally, the point light source 2 is disposed on a side of the at least one light sensing unit 1 away from the base 10, and light emitted from the point light source 2 is able to be reflected back into the at least one light sensing unit 1 after being irradiated to the finger. Of course, it is also permissible that the point light source 2 is disposed between the at least one light sensing unit 1 and the base 10. In this case, the at least one light sensing unit 1 should not block the light emitted from the point light source 2.

In some examples, the fingerprint identification sensor 100 further includes a light transmission cover plate 3, such as a glass cover plate. The light transmission cover plate 3 is generally disposed on a side of the at least one light sensing unit 1 and the at least one point light source 2 away from the base 10.

In some embodiments, each light sensing unit 1 includes at least two light sensing sub-units, and the at least two light sensing sub-units are able to collect the at least two different monochromatic lights in a one-to-one correspondence manner.

Figure 5:
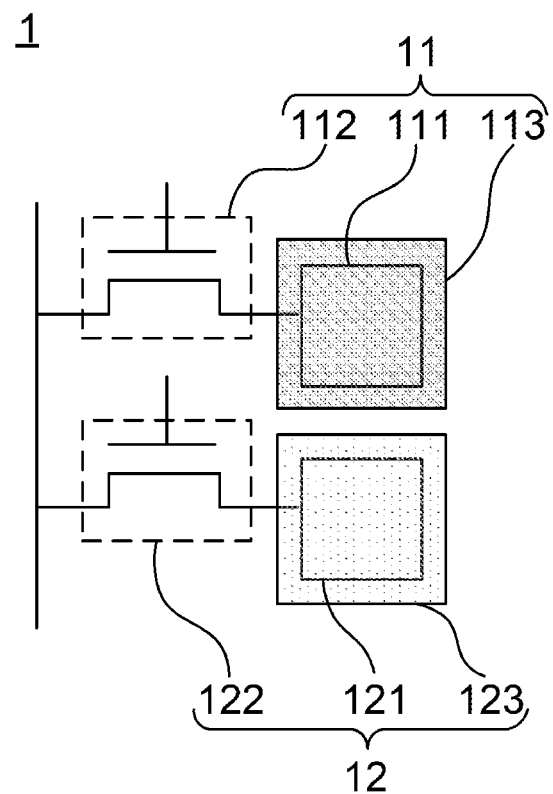
FIG. 5 is a schematic diagram of a structure of a light sensing unit, according to some embodiments of the present disclosure.

In some examples, as shown in FIG. 5, each light sensing unit 1 includes two light sensing sub-units, which are a first light sensing sub-unit 11 and a second light sensing sub-unit 12, respectively. The first light sensing sub-unit 11 includes: a first photosensitive diode 111, a first thin film transistor 112 electrically connected to the first photosensitive diode 111, and a first filter portion 113 disposed on a light incident side of the first photosensitive diode 111. The second light sensing sub-unit 12 includes: a second photosensitive diode 121, a second thin film transistor 122 electrically connected to the second photosensitive diode 121, and a second filter portion 123 disposed on a light incident side of the second photosensitive diode 121. Wavelength ranges of optical signals allowed to be transmitted by the first filter portion 113 and the second filter portion 123 are different. That is, wavelength ranges of optical signals allowed to be transmitted by filter portions of different light sensing sub-units in a same light sensing unit 1 are different, so that the light sensing sub-units are able to separately collect the different monochromatic lights.

For example, color resist layers with different colors are used in the filter portions of the different light sensing sub-units in the same light sensing unit 1. For example, the first filter portion 113 is a green color resist layer, and the second filter portion 123 is a red color resist layer. In this way, it is not only convenient for manufacturing each light sensing unit 1, but also conducive to reducing the production cost of each light sensing unit 1.

As will be seen from the above, a difference between the first light sensing sub-unit 11 and the second light sensing sub-unit 12 is that the wavelength ranges of the optical signals allowed to be transmitted by the filter portions of the first light sensing sub-unit 11 and the second light sensing sub-unit 12 are different. In addition, the first light sensing sub-unit 11 and the second light sensing sub-unit 12 have the same optical signal collection principle. A process of collecting a corresponding monochromatic light will be described below by taking the first light sensing sub-unit 11 as an example.

Figure 6:
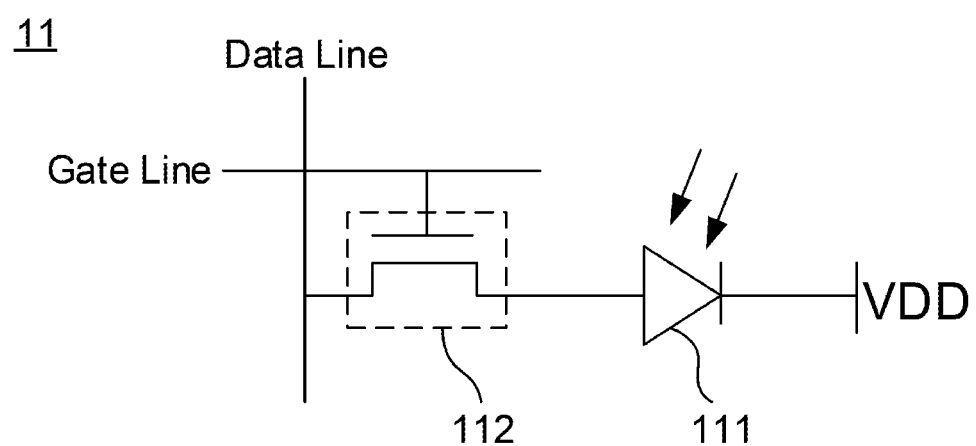
FIG. 6 is a schematic circuit diagram of a light sensing sub-unit, according to some embodiments of the present disclosure.

In the first light sensing sub-unit 11, as shown in FIG. 6, a control electrode of the first thin film transistor 112 is electrically connected to a gate line (Gate Line), a first electrode of the first thin film transistor 112 is electrically connected to a data line (Data Line), and a second electrode of the first thin film transistor 112 is electrically connected to an anode of the first photosensitive diode 111. A cathode of the first photosensitive diode 111 is electrically connected to a power supply voltage terminal (VDD terminal). The first filter portion 113 is located at the light incident side of the first photosensitive diode 111. After the light reflected by a finger passes through the first filter portion 113 and is irradiated onto the first photosensitive diode 111, the first photosensitive diode 111 is controlled to be turned on. In a case where the gate line controls the first thin film transistor to be turned on, the first photosensitive diode 111 is able to output an electrical signal to the data line according to the monochromatic light filtered by the first filter portion 113 from the light reflected by a finger, thereby completing a collection of the corresponding monochromatic light by the first light sensing sub-unit 11.

Figure 7:
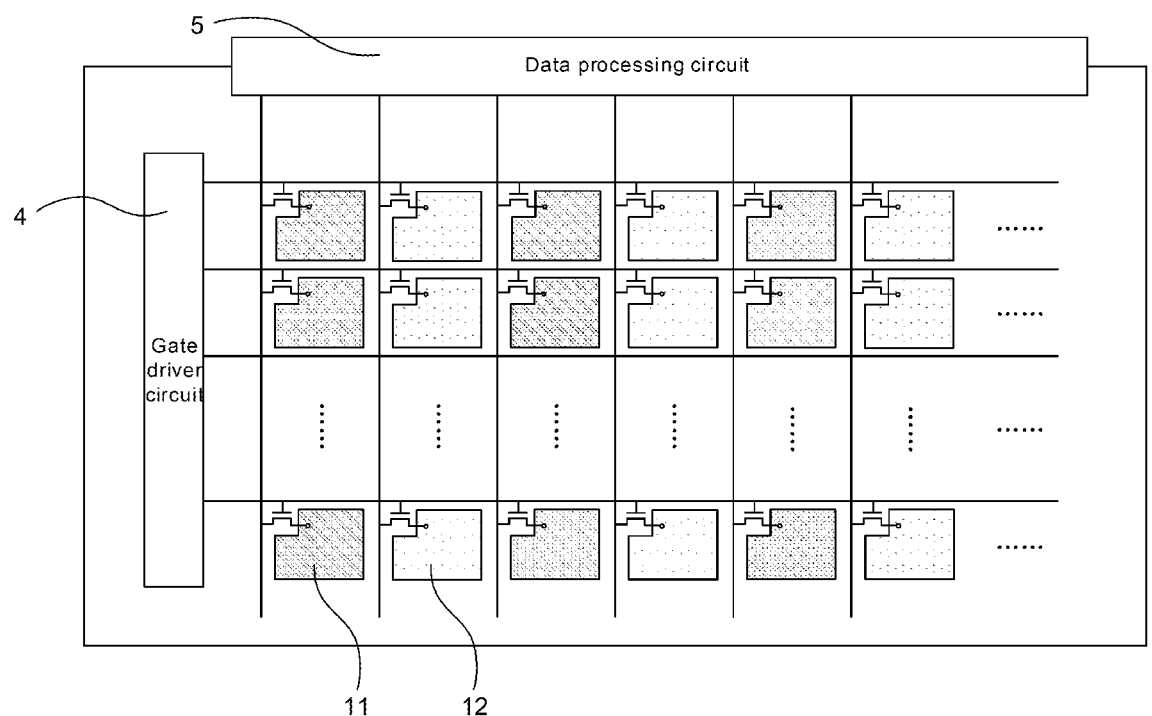
FIG. 7 is a schematic diagram of a distribution of a light sensing unit, according to some embodiments of the present disclosure.

In addition, in a case where the fingerprint identification sensor 100 includes a plurality of light sensing units 1, as shown in FIG. 7, the plurality of light sensing units 1 are generally arranged in an array.

Optionally, as shown in FIG. 7, the fingerprint identification sensor 100 further includes a gate driver circuit 4 and a data processing circuit 5 that are disposed on the base. A gate of a thin film transistor of each light sensing sub-unit in each row of light sensing sub-units is electrically connected to the gate driver circuit 4 through a gate line, and a first electrode of a thin film transistor of each light sensing sub-unit in each column of light sensing sub-units is electrically connected to the data processing circuit 5 through a data line. In this way, the thin film transistor in a corresponding light sensing sub-unit is controlled to be turned on by the gate driver circuit 4, and therefore in a case where each light sensing sub-unit outputs an electric signal configured to represent the monochromatic light, the electric signal is output to the data processing circuit 5 for data-processing through a corresponding data line, so as to complete the fingerprint identification.

The control electrode of the thin film transistor is generally a gate, and the first electrode of the thin film transistor may be a source or a drain. For example, the first electrode of the thin film transistor is a source, and a second electrode of the thin film transistor is a drain; or the first electrode of the thin film transistor is a drain, and the second electrode of the thin film transistor is a source.

According to meanings expressed in FIGS. 10 and 11, it will be seen that signal intensities that can be collected from blue light (wavelength being 400 nm-480 nm), green light (wavelength being 500 nm-560 nm) and red light (wavelength being 600 nm-660 nm) in the light reflected by valleys are different, and there is a great difference between every two pairs; yet signal amounts that can be collected from green light (wavelength 500 nm-560 nm) and red light (wavelength 600 nm-660 nm) in the light reflected by ridges are substantially the same. Although there is a difference between signal intensities that can be collected from blue light (wavelength 400 nm-480 nm) in the light reflected by ridges and green light in the light reflected by ridges, the difference is much less than a difference between signal intensities that can be collected from blue light in the light reflected by valleys and green light in the light reflected by valleys.

On the basis of the spectral diagrams shown in FIGS. 10 and 11, it will be seen that in a case where the first filter portion 113 is a green color resist layer and the second filter portion 123 is a red color resist layer, if a signal intensity of the green light in the light reflected by a finger collected by the light sensing unit 1 is Sg, a signal intensity of the red light is Sr, and a difference between the two signal intensities (i.e., Sg−Sr) is zero or proximate to zero, then the light reflected by a finger is the light reflected by ridges, and may be used as imaging light of the ridges in the fingerprint. Conversely, if an absolute value of the difference between the two signal intensities (i.e., |Sg−Sr|) is greater than a first threshold value $T_1$, then the light reflected by a finger is the light reflected by valleys, and may be used as imaging light of the valleys in the fingerprint. Therefore, in the fingerprint identification sensor provided by some embodiments of the present disclosure, by determining a magnitude relationship between the first threshold value $T_1$ and a difference between signal intensities of the two monochromatic lights in the light reflected by a finger, a contrast between the light reflected by valleys and the light reflected by ridges is made to be relatively large, so that it may be accurately determined whether the light reflected by a finger is the light reflected by valleys or the light reflected by ridges, and the fingerprint identification accuracy and the reliability during the use of the fingerprint identification sensor may be effectively improved.

Herein, the first threshold value $T_1$ is selectively set according to actual needs, which is not limited in some embodiments of the present disclosure.

In addition, the fingerprint identification sensor identifies the fingerprint on the basis of the optical characteristics of human skin. As a result, compared with the fingerprint sleeve made of materials such as silica gel, the finger has the characteristic of selectively absorbing the light incident to the finger, and light formed through being reflected by the finger and light formed through being reflected by the fingerprint sleeve have significantly different spectra. For example, if the light reflected by a finger is the light reflected by ridges, the difference between signal intensities of the red light and the green light will be zero or proximate to zero, but the difference between signal intensities of the spectral lines of the red light and the green light in the light reflected by ridges formed through being reflected by the fingerprint sleeve is relatively great. That is, there is a significant difference therebetween.

Therefore, in the process of identifying the fingerprint, on a basis of a reasonably set threshold value (for example, 0±C, C is a constant), after the corresponding threshold value and the difference between the signal intensities of the two monochromatic lights in the light reflected by a finger are compared, it may be determined whether the light reflected by a finger is light reflected by a real finger (i.e., light directly reflected by the user's finger) or light reflected by a fake finger (i.e., light reflected by an object having an imitated fingerprint, such as the fingerprint sleeve), so that potential security risks in the process of identifying the fingerprint are reduced, and security during the use of the fingerprint identification sensor and application equipment thereof is effectively improved.

Of course, the method for identifying the light reflected by valleys and the light reflected by ridges in the light reflected by a finger is not limited to the above embodiments. In some other examples, a second threshold value $T_2$ and a third threshold value $T_3$ are set respectively, and the second threshold value $T_2$ is made to be less than the third threshold value $T_3$ (i.e., $T_2<T_3$). By determining whether the absolute value of the difference between the signal intensities of the green light and the red light in the light reflected by a finger (i.e., |Sg−Sr|) is less than the second threshold value $T_2$ or greater than the third threshold value $T_3$, the light reflected by valleys and the light reflected by ridges in the light reflected by a finger may also be identified. For example, if the absolute value of the difference between the signal intensities of the two (i.e., |Sg−Sr|) is less than the second threshold value $T_2$, the light reflected by a finger is the light reflected by ridges, and may be used as the imaging light of the ridges in the fingerprint. If the absolute value of the difference between the signal intensities of the two (i.e., |Sg−Sr|) is greater than the third threshold value $T_3$, the light reflected by a finger is the light reflected by valleys, and may be used as the imaging light of the valleys in the fingerprint.

Boundaries between the light reflected by valleys and the light reflected by ridges in the light reflected by a finger may be made clearer through the second threshold value $T_2$ and the third threshold value $T_3$. In this way, after the two different monochromatic lights in the light reflected by a finger are collected by the first light sensing sub-unit 11 and the second light sensing sub-unit in each light sensing unit 1, according to a magnitude relationship between the second threshold value $T_2$ or the third threshold value $T_3$ and a difference between the signal intensities of the two different monochromatic lights, the contrast between the light reflected by valleys and the light reflected by ridges may be effectively increased. Therefore, it may be more accurately determined whether the light reflected by a finger is the light reflected by valleys or the light reflected by ridges, and the fingerprint identification accuracy and the reliability during the use of the fingerprint identification sensor may be further effectively improved.

Figure 8:
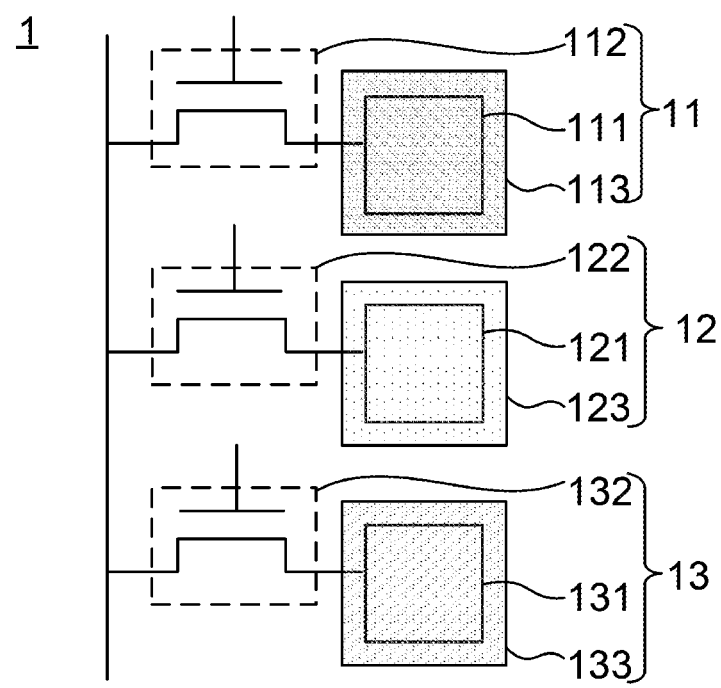
FIG. 8 is a schematic diagram of a structure of another light sensing unit, according to some embodiments of the present disclosure.

In some other examples, as shown in FIG. 8, each light sensing unit 1 includes three light sensing sub-units, which are a first light sensing sub-unit 11, a second light sensing sub-unit 12 and a third light sensing sub-unit 13, respectively. Structures of the first light sensing sub-unit 11 and the second light sensing sub-unit 12 are the same as those in the above examples, and details will not be described herein again. The third light sensing sub-unit 13 includes: a third photosensitive diode 131, a third thin film transistor 132 electrically connected to the third photosensitive diode 131, and a third filter portion 133 disposed on a light incident side of the third photosensitive diode 131. Wavelength ranges of optical signals allowed to be transmitted by the first filter portion 113, the second filter portion 123 and the third filter portion 133 are different. That is, wavelength ranges of optical signals allowed to be transmitted by filter portions of different light sensing sub-units in a same light sensing unit 1 are different, so that the light sensing sub-units may collect different monochromatic lights, separately.

Figure 9:
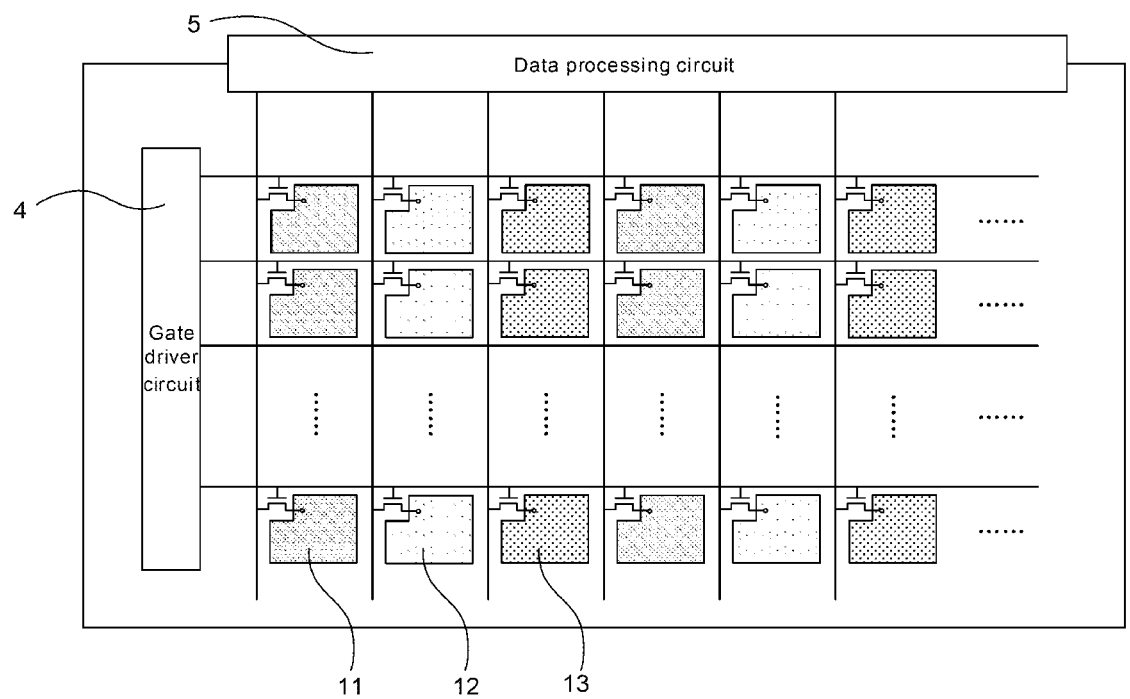
FIG. 9 is a schematic diagram of a distribution of another light sensing unit, according to some embodiments of the present disclosure.

In addition, in a case where the fingerprint identification sensor 100 includes a plurality of light sensing units 1, as shown in FIG. 9, the plurality of light sensing units 1 are generally arranged in an array.

Differences between the first light sensing sub-unit 11, the second light sensing sub-unit 12 and the third light sensing sub-unit 13 lie in that wavelength ranges of optical signals that are allowed to be transmitted by filter portions of the first light sensing sub-unit 11, the second light sensing sub-unit 12 and the third light sensing sub-unit 13 are different. In addition, the first light sensing sub-unit 11, the second light sensing sub-unit 12 and the third light sensing sub-unit 13 have a same principle of collecting optical signals. Reference can be made to the relevant expressions in some embodiments described above, and details will not be described herein.

In a case where the light sensing unit 1 is as shown in FIG. 8, the first light sensing sub-unit 11, the second light sensing sub-unit 12 and the third light sensing sub-unit 13 are able to collect the different monochromatic lights. For example, the first filter portion 113 of the first light sensing sub-unit 11 is a green color resist layer, and the first light sensing sub-unit 11 is able to collect the green light. The second filter portion 123 of the second light sensing sub-unit 12 is a red color resist layer, and the second light sensing sub-unit 12 is able to collect the red light. The third filter portion 123 of the third light sensing sub-unit 13 is a blue color resist layer, and the third light sensing sub-unit 13 is able to collect the blue light. Of course, other materials with narrower filter bandwidths may be used for the filter portions in the different light sensing sub-units, e.g., an optical medium film.

Therefore, after three monochromatic lights (e.g., the green light, the red light and the blue light) of the light reflected by a finger are collected by the light sensing unit 1, it may be determined whether the light reflected by a finger is the imaging light of valleys in the fingerprint or the imaging light of ridges in the fingerprint according to a difference of signal intensities of any two of the three monochromatic lights. That is, any two monochromatic lights (e.g., the red light and the green light, the red light and the blue light, or the green light and the blue light) are selected from the three monochromatic lights, and then it may be correspondingly determined whether the corresponding light reflected by a finger is the imaging light of the valleys in the fingerprint or the imaging light of the ridges in the fingerprint according to the difference between the signal intensities of the two selected monochromatic lights.

Herein, the method for determining whether the light reflected by a finger is the imaging light of the valleys or the ridges in the fingerprint according to the difference of the signal intensities of the two selected monochromatic lights may be performed with reference to the relevant descriptions in the embodiments described above, and details will not be described herein again.

Of course, with reference to FIGS. 10 and 11, it will be seen that the differences between the signal intensity of the red light and the signal intensity of the green light are significantly different in a case where the light reflected by a finger is the light reflected by valleys and in a case where the light reflected by a finger is the light reflected by ridges. Therefore, in some embodiments, colors of color resist layers of different light sensing sub-units in the same light sensing unit 1 include at least red and green. In this case, a relatively high contrast may be obtained, thereby improving the fingerprint identification accuracy.

It will be noted that the number of light sensing sub-units in the light sensing unit 1 is not limited to two or three, and there may be more light sensing sub-units in the light sensing unit 1. In addition, some embodiments of the present disclosure do not limit central wavelengths of the optical signals allowed to be transmitted by the filter portions of different light sensing sub-units in the same light sensing unit 1, and the central wavelengths may be selected according to actual needs. Optionally, a center wavelength of the optical signal allowed to be transmitted by the first filter portion 113 of the first light sensing sub-unit 11 is 534 nm, and a center wavelength of the optical signal allowed to be transmitted by the second filter portion 123 of the second light sensing sub-unit 12 is 622 nm.

In summary, in some embodiments of the present disclosure, the at least two different monochromatic lights in the light reflected by a finger may be collected in a one-to-one correspondence manner by the at least two light sensing sub-units in each light sensing unit 3, so as to determine whether the light reflected by a finger is the imaging light of the valleys in the fingerprint or the imaging light of the ridges in the fingerprint according to the difference between the signal intensities of any two monochromatic lights in the at least two different monochromatic lights. Since the spectrums of the light reflected by valleys and the light reflected by ridges are obviously different, whether the light reflected by a finger is the imaging light of the valleys in the fingerprint or the imaging light of the ridges in the fingerprint is determined according to the difference between the signal intensities of any two monochromatic lights in the light reflected by a finger, which may make the contrast and the identification accuracy high.

Figure 12:
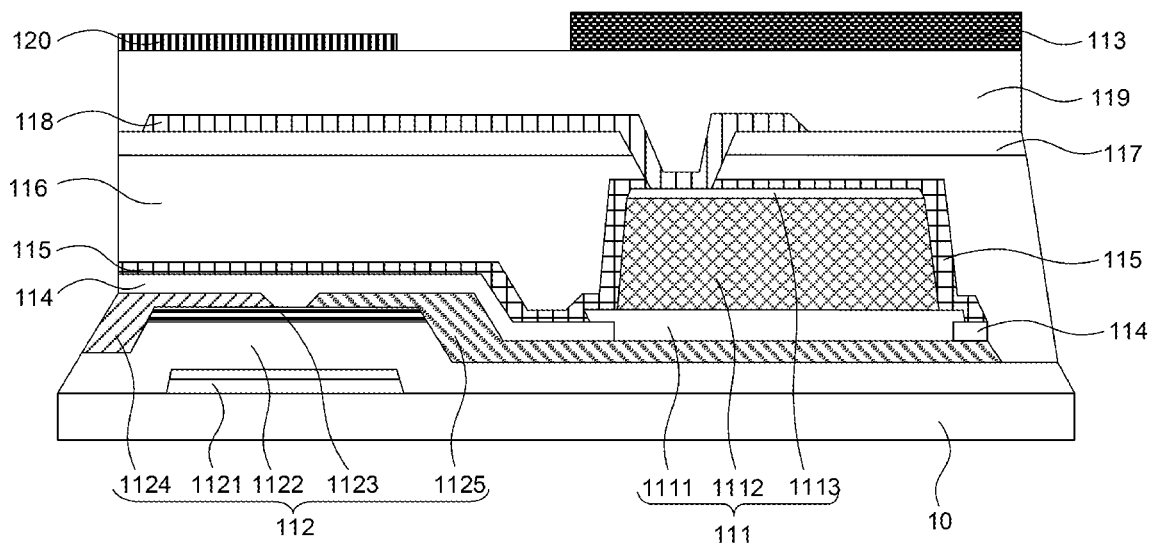
FIG. 12 is a schematic diagram of a structure of a light sensing sub-unit, according to some embodiments of the present disclosure.

In order to describe the structure of the fingerprint identification sensor 100 in some embodiments described above more clearly, a cross-sectional view of a light sensing sub-unit (e.g., the first light sensing sub-unit 11) in the fingerprint identification sensor 100 is showed in FIG. 12.

Referring to FIG. 12, in the first light sensing sub-unit 11, the first thin film transistor 112 is disposed on the base 10, and the first thin film transistor 112 includes: a gate electrode 1121, a gate insulating layer 1122 and an active layer 1123 that are all stacked sequentially, and a first electrode 1124 and a second electrode 1125 that are electrically connected to the active layer 1123.

The light sensing sub-unit 11 further includes a first passivation layer 114 disposed on surfaces of the first electrode 1124 and the second electrode 1125 of the first thin film transistor 112 facing away from the base 10. The first photosensitive diode 111 is disposed on a side of the first thin film transistor 112 away from the base 10, and is generally formed on a surface of the first passivation layer 114 facing away from the base 10. The first photosensitive diode 111 includes an anode 1111, a PIN photosensitive layer 1112 and a cathode 1113 that are all stacked in a direction away from the base 10. The anode 1111 of the first photosensitive diode 111 is electrically connected to the second electrode 1125 of the first thin film transistor 112, and the anode 1111 may be a metal electrode or a light-transmitting electrode. The cathode 1113 of the first photosensitive diode 111 is disposed on a light incident side of the PIN photosensitive layer 1112. The cathode 1113 is a light-transmitting electrode, such as an indium tin oxide (ITO) electrode.

With continued reference to FIG. 12, the first light sensing sub-unit 11 further includes: an encapsulation layer 115, a planarization layer 116 and a second passivation layer 117 that are all stacked on surfaces of the first passivation layer 114 and the first photosensitive diode 111 facing away from the base 10. The encapsulation layer 115 is able to encapsulate the first thin film transistor 112 and the first photosensitive diode 111 and protect them, so as to prevent the external environment from affecting the conductive performance of the first thin film transistor 112 and the first photosensitive diode 111. A surface of the second passivation layer 117 is provided with a wire 118 electrically connected to the power supply voltage terminal, and the cathode 1113 of the first photosensitive diode 111 is electrically connected to the power supply voltage terminal (VDD terminal) through the wire 118.

With continued reference to FIG. 12, the first light sensing sub-unit 11 further includes a buffer layer 119 disposed on a side of the wire 118 away from the base 10. The buffer layer 119 is mostly made of an inorganic material, and has a high supporting strength. The first filter portion 113 is disposed on a side of the buffer layer 119 away from the base 10, and an orthographic projection of the PIN photosensitive layer 1112 on the base 10 is within an orthographic projection of the first filter portion 113 on the base 10.

In addition, the first light sensing sub-unit 11 further includes a bonding wire 120 disposed on a side of the buffer layer 119 away from the base 10, so as to implement electrical connections of electrodes or wires in the first light sensing sub-unit 11 to external circuits by utilizing the bonding circuit 120.

In some embodiments described above, the light sensing sub-units in the light sensing unit 1 may each use the structure as shown in FIG. 12 or other structures capable of realizing the collection of corresponding monochromatic lights, which is not limited in some embodiments of the present disclosure.

Figure 13:
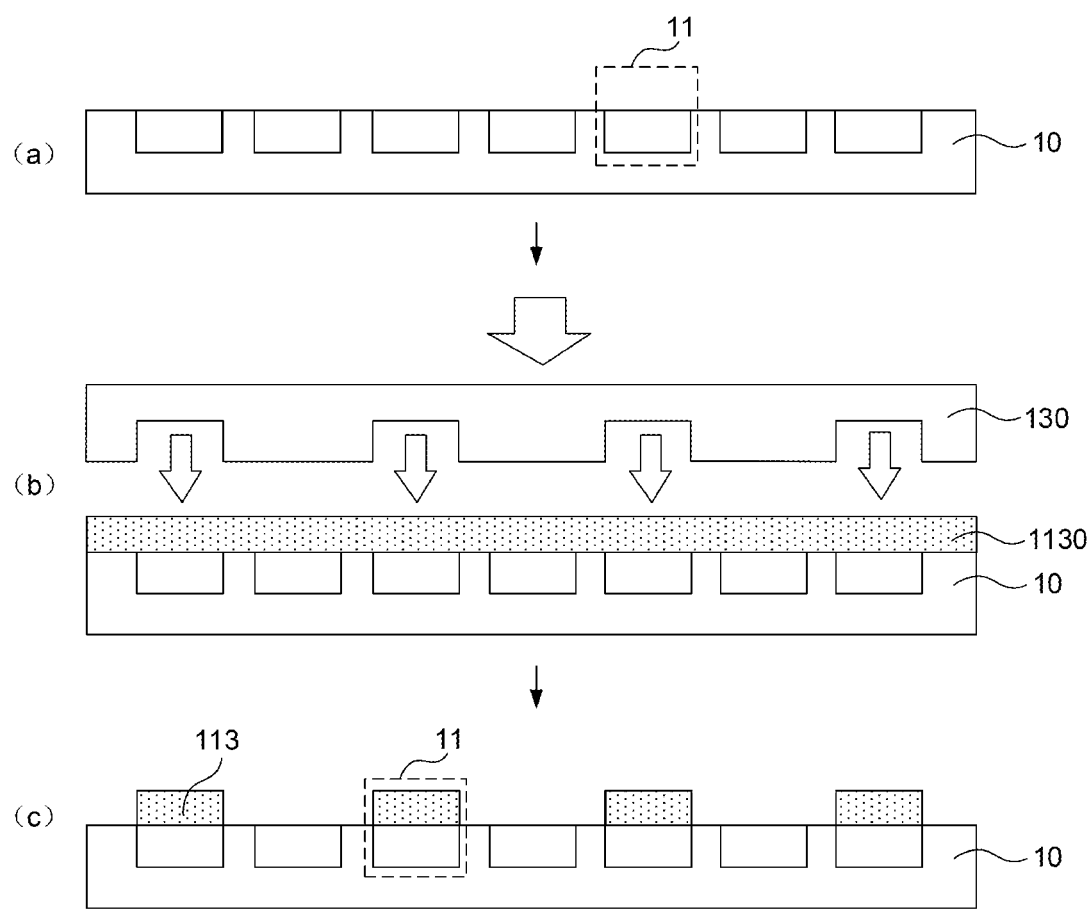
FIG. 13 is a schematic diagram showing steps of a method of manufacturing a fingerprint identification sensor, according to some embodiments of the present disclosure.

In a process of manufacturing the fingerprint identification sensor 100, steps of manufacturing the light sensing sub-units in each light sensing unit 1 may be performed with reference to FIG. 13. That the light sensing sub-units are the first light sensing sub-units 11 is taken as an example in FIG. 13. First, as shown in FIG. 13(a), a base 10 is provided, and portions of each light sensing sub-unit other than the filter portion, i.e., thin film transistors and the photosensitive diode in each light sensing sub-unit, are formed on the base 10. Then, as shown in FIG. 13(b), a first filter layer 1130 is coated on a portion of the base 10 on which the light sensing sub-units have been formed, and a photoetching process is performed on the first filter layer 1130 through a photomask, so that a plurality of first filter portions 113 as shown in FIG. 13(c) may be formed. That is, a formation of the first light sensing sub-units 11 is completed.

Figure 14:
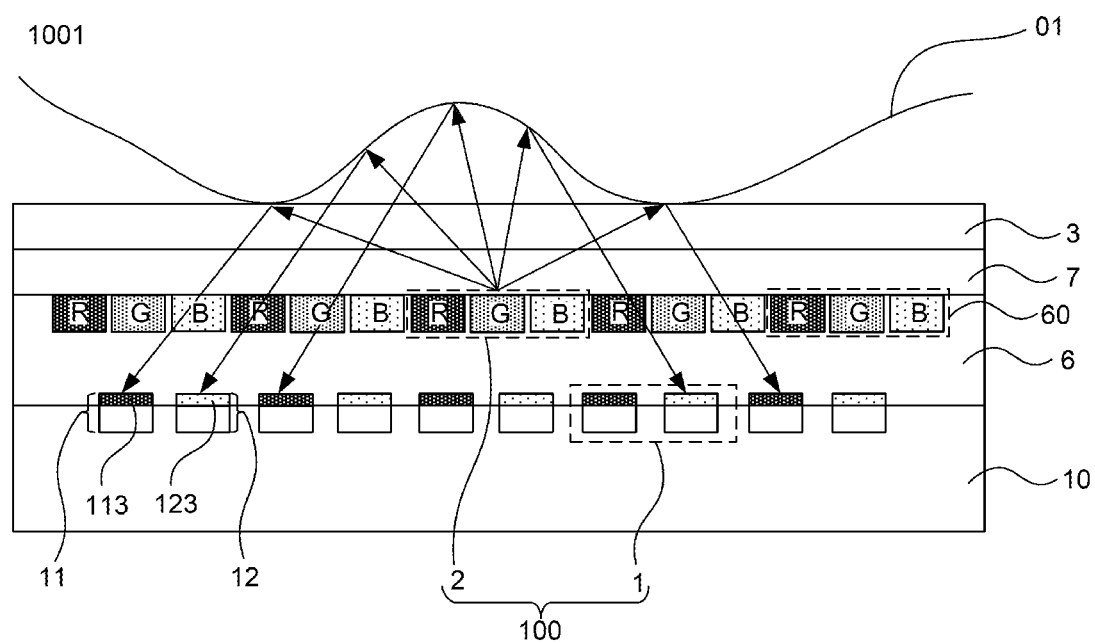
FIG. 14 is a schematic diagram of a structure of a display substrate, according to some embodiments of the present disclosure.

Some embodiments of the present disclosure provide a display substrate. As shown in FIG. 14, the display substrate 1001 includes the fingerprint identification sensor 100 as described in any above embodiment, and a pixel layer 6 disposed on a light incident side of each light sensing unit 1 in the fingerprint identification sensor 100. Herein, the light incident side of the light sensing unit 1 refers to a side of the light sensing unit 1 configured to receive the light reflected by a finger. Beneficial effects achieved by the display substrate provided by some embodiments of the present disclosure are the same as the beneficial effects achieved by the fingerprint identification sensor provided by some embodiments above, and details will not be described herein again.

The fingerprint identification sensor 100 is integrated in the display substrate 1001, and a light-emitting device or a light source in the display substrate 1001 may be utilized to provide the optical signal for the fingerprint identification sensor 100. That is, the light-emitting device or the light source in the display substrate 1001 is used as a light source of a corresponding fingerprint identification sensor 100. In addition, the fingerprint identification sensor 100 may be integrated as a separate component in the display substrate 1001, or may be integrated with other components in the display substrate 1001. Some embodiments of the present disclosure do not limit a manner in which the fingerprint identification sensor 100 is arranged in the display substrate 1001, and it may be selectively set according to actual needs.

In some examples, with continued reference to FIG. 14, the display substrate 1001 is an organic light-emitting diode (OLED) substrate. The pixel layer 6 includes a plurality of pixels 60, and at least one pixel 60 of the plurality of pixels 60 is used as a point light source of the fingerprint identification sensor 100. White light emitted by the at least one pixel 60 may be used as initial light of the light reflected by a finger to be collected by the fingerprint identification sensor 100.

The type of an OLED in each pixel 60 in the OLED substrate is related to a display mode and a structure of the OLED substrate.

Optionally, an RGB color display mode is applied to the OLED substrate, and a structure of "WOLED+color filter" is used in the OLED substrate, that is, each OLED in the OLED substrate is a WOLED, and each pixel 60 includes: three WOLEDs and color filters (including a red filter, a green filter and a blue filter) disposed on light-emitting sides of the three WOLEDs. In this way, the at least one pixel 60 in the OLED substrate may be used as the point light source of the fingerprint identification sensor 100, that is, the white light emitted by the at least one pixel 60 is used as the initial light of the light reflected by a finger which is to be collected by the fingerprint identification sensor 100.

Optionally, the RGB color display mode is applied in the OLED substrate, and a structure of color OLED is used in the OLED substrate, that is, the OLEDs in the OLED substrate include three types of OLEDs which are red OLEDs, green OLEDs and blue OLEDs. Each pixel 60 includes three light-emitting devices which are a red OLED, a green OLED and a blue OLED, and light emitted from the three light-emitting devices in each pixel 60 appears white after being mixed. In this way, a plurality of color OLEDs corresponding to the at least one pixel 60 are together used as the point light source of the fingerprint identification sensor 100, so that the white light emitted by the at least one pixel 60 may be conveniently used as the initial light of the light reflected by a finger which is to be collected by the fingerprint identification sensor 100.

For example, as shown in FIG. 14, the display substrate 1001 is the OLED substrate, and the OLED substrate includes the base 10, the plurality of light sensing units 1 and the pixel layer 6, etc. The plurality of light sensing units 1 are disposed on the base 10, and each light sensing unit 1 includes a first light sensing sub-unit 11 and a second light sensing sub-unit 12. Structures of the first light sensing sub-unit 11 and the second light sensing sub-unit 12 are the same as those in some embodiments described above. The pixel layer 6 is located on a side of the light sensing units 1 away from the base 10. The pixel layer 6 includes a plurality of pixels 60. Each pixel includes three sub-pixels, and the three sub-pixels are a red sub-pixel R, a green sub-pixel G and a blue sub-pixel B, respectively. A red OLED is correspondingly used in the red sub-pixel R, a green OLED is correspondingly used in the green sub-pixel G, and a blue OLED is correspondingly used in the blue sub-pixel B. The red OLED, the green OLED and the blue OLED corresponding to the three sub-pixels in each pixel 60 may be together used as the point light source 2 of the fingerprint identification sensor 100. A side of the pixel layer 6 away from the base 10 is generally provided with other functional films 7, such as an encapsulation layer, a touch layer, or a polarizer.

Figure 15:
FIG. 15 is a schematic diagram of another fingerprint image, according to some embodiments of the present disclosure.

After the color OLEDs in the OLED substrate are turned on, the red OLED, the green OLED and the blue OLED corresponding to each pixel serve as the point light source 2 of the fingerprint identification sensor 100 and emit light to a user's finger, so that the user's finger may reflect the light, and thus the red light and the green light in the light reflected by a finger are collected by the light sensing units 1. In this way, fingerprint identification is performed by using the fingerprint identification sensor 100, so that a fingerprint image as shown in FIG. 15 may be obtained.

Figure 16:
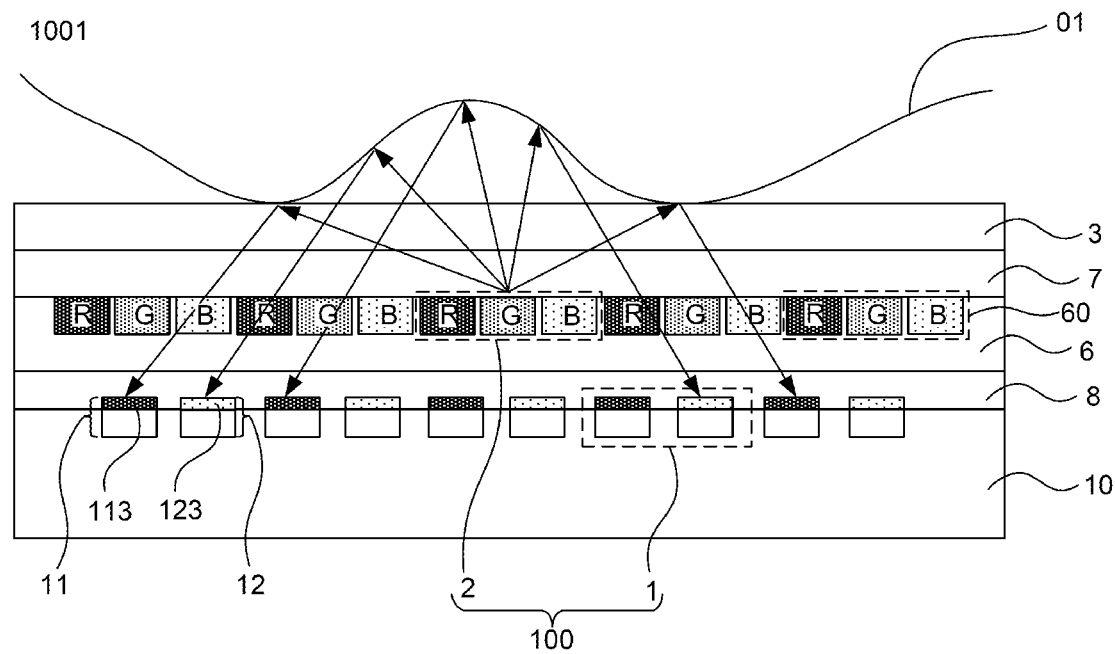
FIG. 16 is a schematic diagram of a structure of another display substrate, according to some embodiments of the present disclosure.

It will be added that, in some embodiments, as shown in FIG. 16, the display substrate 1001 further includes a collimating optical layer 8 disposed between a plurality of light sensing units 1 and the pixel layer 6. A structure of the optical collimating layer 8 may be selectively set according to actual needs. The collimating optical layer 8 is generally formed on a surface of the plurality of light sensing units 1 proximate to the pixel layer 6. In this way, by utilizing the optical collimating layer 8, a diffusion angle of the light reflected by a finger may be effectively reduced, which makes each light sensing unit 1 easy to collect the light reflected by a finger that has been collimated by the optical collimating layer 8, thereby improving the fingerprint identification accuracy.

In addition, in some other examples, the display substrate 1001 is a liquid crystal display substrate, and the liquid crystal display substrate includes a collimating optical layer. The optical collimating layer may be used as the light source in the fingerprint identification sensor 100, so as to provide the fingerprint identification sensor 100 with light which is necessary for fingerprint identification. A structure of the optical collimating layer and structures of other films in the liquid crystal display substrate may be selectively set according to actual needs.

Figure 17:
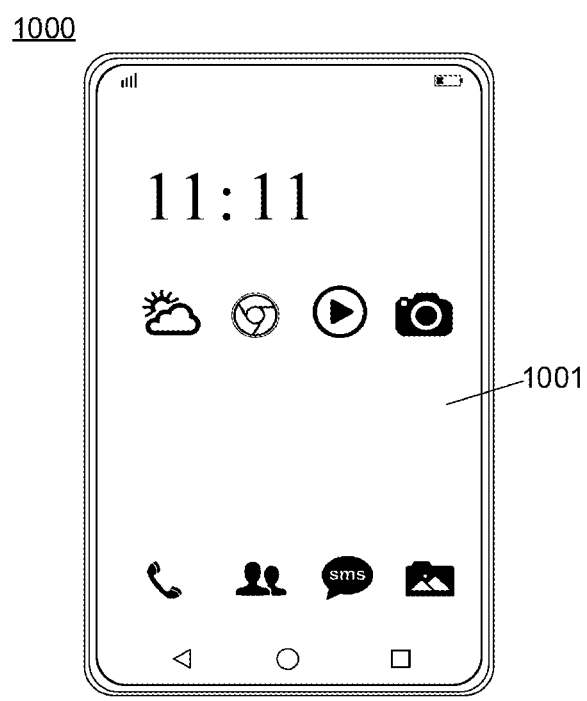
FIG. 17 is a schematic diagram of a structure of a display device, according to some embodiments of the present disclosure.

Some embodiments of the present disclosure provide a display device. As shown in FIG. 17, the display device 1000 includes the display substrate 1001 as described in some above embodiments. Beneficial effects achieved by the display device provided by some embodiments of the present disclosure are the same as the beneficial effects achieved by the display substrate provided by above some embodiments, and details will not be described herein again.

In some examples, the display device is an OLED display device, an LCD display device, a QLED display device, a Mini LED display device, a Micro LED display device, or the like.

The display device provided by some embodiments of the present disclosure may be any device that is applied to the field of display and displays an image whether moving (e.g., a video) or stationary (e.g., a still image), and whether literal or graphical. More specifically, it is anticipated that the embodiments may be implemented in a variety of electronic devices including, but not limit to mobile phones, wireless devices, portable android devices (PAD), hand-held or portable computers, global positioning system (GPS) receivers/ navigators, cameras, MPEG-4 Part 14 (MP4) video players, video cameras, TV monitors, flat panel displays, computer monitors and aesthetic structures (e.g., a display for displaying an image of a piece of jewelry), etc.

In addition, the application of the fingerprint identification sensor 100 in some embodiments described above is not limited to the display field. Other devices or equipment that requires fingerprint identification are also applicable.

Optionally, some embodiments of the present disclosure provide a fingerprint identification device, such as a fingerprint attendance machine. In this way, on the basis of the fingerprint identification principle of the fingerprint identification sensor 100 in some embodiments of the present disclosure, the fingerprint identification device not only is able to identify the user's fingerprint accurately, but also is able to identify the light is reflected by a real or a fake finger, so as to avoid potential security risks of the fingerprint identification device (which may cause economical losses to the user).

Some embodiments of the present disclosure provide a fingerprint identification method, which is applied to the fingerprint identification sensor 100 in some embodiments described above and any display device or fingerprint identification device including the fingerprint identification sensor 100.

Figure 18:
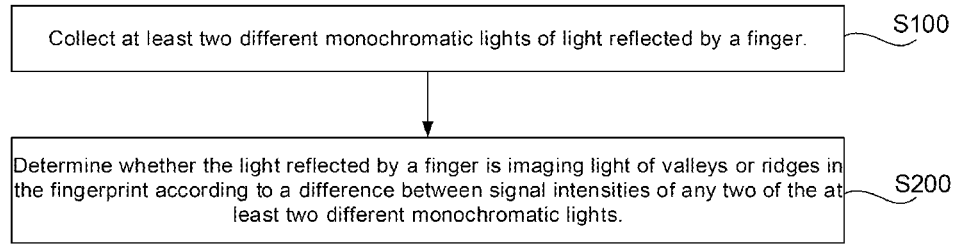
FIG. 18 is a schematic flow chart of a fingerprint identification method, according to some embodiments of the present disclosure.

Referring to FIG. 18, the fingerprint identification method includes S100 to S200.

In S100, the at least two different monochromatic lights of the light reflected by a finger are collected.

Herein, the light reflected by a finger is the polychromatic light. That is, light irradiated to the finger should be composite light including at least two monochromatic lights of different wavelengths, e.g., white light. Herein, the light irradiated to the finger may be provided by the external light source or the built-in light source of the fingerprint identification sensor 100.

In S200, it is determined whether the light reflected by a finger is imaging light of valleys in a fingerprint or imaging light of ridges in the fingerprint according to a difference between signal intensities of any two of the at least two different monochromatic lights.

Beneficial effects achieved by the fingerprint identification method provided in some embodiments of the present disclosure are the same as the beneficial effects achieved by the fingerprint identification sensor provided in some embodiments described above, and details will not be described herein again.

Figure 19:
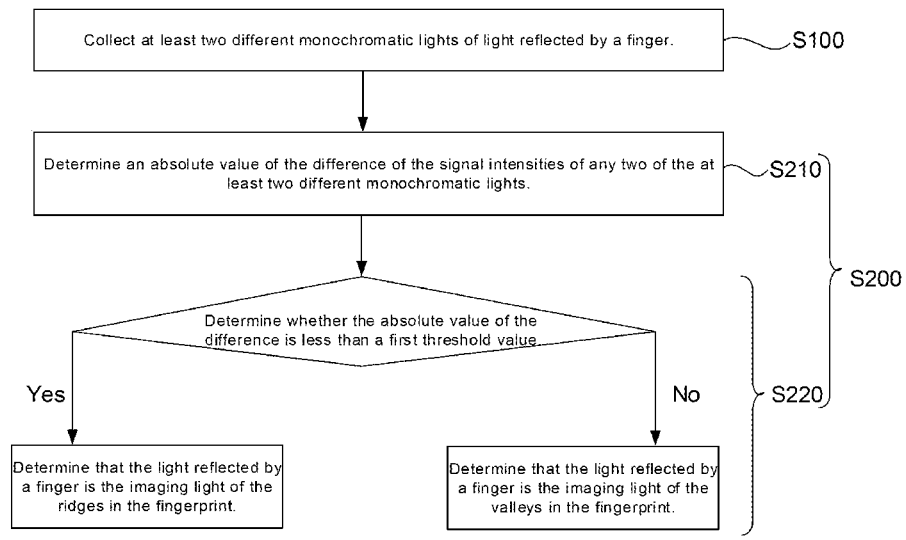
FIG. 19 is a schematic flow chart of another fingerprint identification method, according to some embodiments of the present disclosure.

In some examples, referring to FIG. 19, S200 includes S210 to S220.

In S210, the absolute value of the difference of the signal intensities of any two of the at least two different monochromatic lights is determined.

In S220, it is determined whether the absolute value of the difference is less than the first threshold value. If the absolute value of the difference is less than the first threshold value, it is determined that the light reflected by a finger is the imaging light of the ridges in the fingerprint. If the absolute value of the difference is not less than the first threshold value, it is determined that the light reflected by a finger is the imaging light of the valleys in the fingerprint.

For example, referring to FIG. 11, in a case where the fingerprint identification sensor is configured to collect the green light and the red light in the light reflected by a finger, if the light reflected by a finger is the light reflected by ridges, it will be seen that a difference between signal intensities of the red light and the green light that can be collected is generally zero or proximate to zero; and if the light reflected by a finger is the light reflected by valleys, it will be seen that the signal intensities corresponding to the red light and the green light that can be collected have a great difference. On this basis, the first threshold value may be set to a value proximate to zero. In this way, after the red light and the green light in the light reflected by a finger are effectively collected by each light sensing unit in the fingerprint identification sensor, it may be determined whether the light reflected by a finger collected correspondingly is the light reflected by ridges or the light reflected by valleys, according to a magnitude relationship between the first threshold value and the absolute value of the difference between the signal intensities of the two. That is, fingerprint imaging may be realized according to the collected light reflected by a finger.

In some embodiments of the present disclosure, by determining the magnitude relationship between the first threshold value and the difference between signal intensities of the two monochromatic lights in the light reflected by a finger, a contrast between the light reflected by valleys and the light reflected by ridges is made to be relatively large, so that it may be accurately determined whether the light reflected by a finger is the light reflected by valleys or the light reflected by ridges of the fingerprint, which may bring effective improvements to the fingerprint identification accuracy, and the reliability and safety during the use of the fingerprint identification sensor.

Of course, the identification method of the light reflected by valleys and the light reflected by ridges in the light reflected by a finger is not limited to the some above examples. In some other examples, a second threshold value and a third threshold value are set respectively, and the second threshold value is made to be less than the third threshold value. Then, by determining whether the absolute value of the difference between signal intensities of the two monochromatic lights in the light reflected by a finger is less than the second threshold value or greater than the third threshold value, the light reflected by valleys and the light reflected by ridges of the light reflected by a finger may also be identified. Moreover, by setting the second threshold value and the third threshold value, boundaries between the light reflected by valleys and the light reflected by ridges in the light reflected by a finger may be made clearer.

Figure 20:
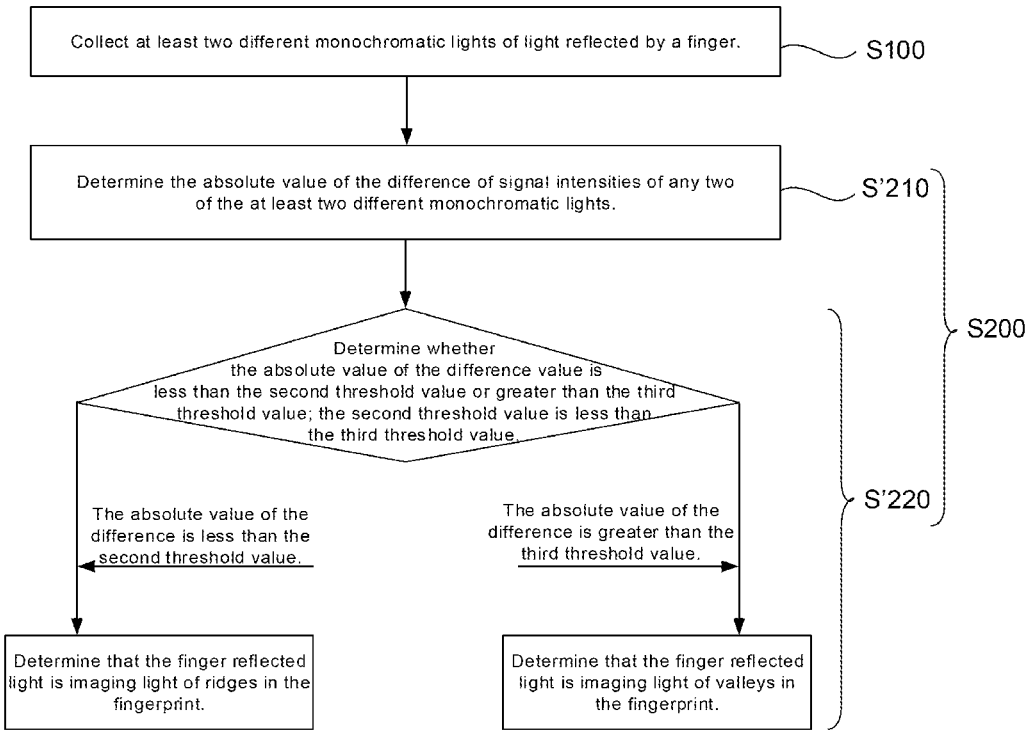
FIG. 20 is a schematic flow chart of yet another fingerprint identification method, according to some embodiments of the present disclosure.

In yet some other examples, referring to FIG. 20, S200 includes S'210 to S'220.

In S'210, the absolute value of the difference between signal intensities of any two of the at least two different monochromatic lights is determined.

In S'220, it is determined whether the absolute value of the difference is less than the second threshold value or greater than the third threshold value. Here, the second threshold value is less than the third threshold value.

If the absolute value of the difference is less than the second threshold value, it is determined that the light reflected by a finger is the imaging light of the ridges in the fingerprint.

If the absolute value of the difference is greater than the third threshold value, it is determined that the light reflected by a finger is the imaging light of the valleys in the fingerprint.

In some embodiments of the present disclosure, after the at least two different monochromatic lights in the light reflected by a finger are collected by each light sensing unit 1 in the fingerprint identification sensor, according to magnitudes of the difference between signal intensities of the two different monochromatic lights, and the second threshold value or the third threshold value, the contrast between the light reflected by valleys and the light reflected by ridges may be effectively increased. Accordingly, it may be more accurately determined whether the light reflected by a finger is the light reflected by valleys or the light reflected by ridges, which may bring effective improvements to the fingerprint identification accuracy, and the reliability and safety during the use of the fingerprint identification sensor.

Figure 21:
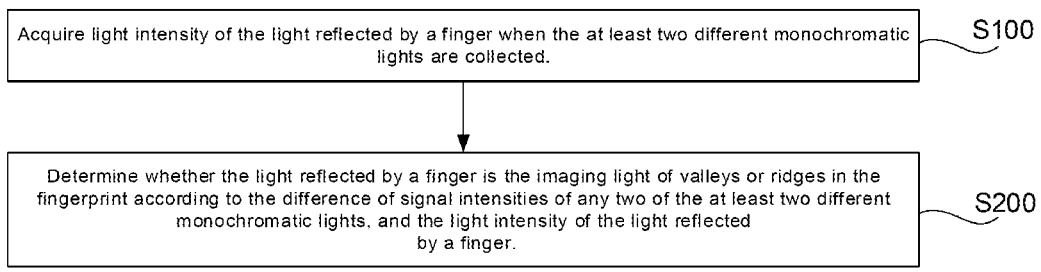
FIG. 21 is a schematic flow chart of yet another fingerprint identification method, according to some embodiments of the present disclosure.

In some other embodiments, referring to FIG. 21, in the S100, collecting the at least two different monochromatic lights in the light reflected by a finger, further includes: acquiring light intensity of the light reflected by a finger when the at least two different monochromatic lights are collected.

In the S200, determining that the light reflected by a finger is the imaging light of the valleys or the ridges in the fingerprint according to the difference between the signal intensities of any two of the at least two different monochromatic lights, further includes: determining whether the light reflected by a finger is the imaging light of the valleys or the ridges in the fingerprint according to the difference between the signal intensities of any two of the at least two different monochromatic lights, and the light intensity of the light reflected by a finger.

In some embodiments of the present disclosure, the at least two different monochromatic lights in the light reflected by a finger and the light intensity of the light reflected by a finger are collected simultaneously by utilizing the fingerprint identification sensor, which may combine a method of identifying the fingerprint according to two monochromatic lights in the light reflected by a finger and a method of identifying the fingerprint according to the light intensity of the light reflected by a finger, so as to obtain the fingerprint image with the high contrast between light and dark. Accordingly, the fingerprint identification accuracy, and the reliability and safety during the use of the fingerprint identification sensor may be further improved.

Figure 22:
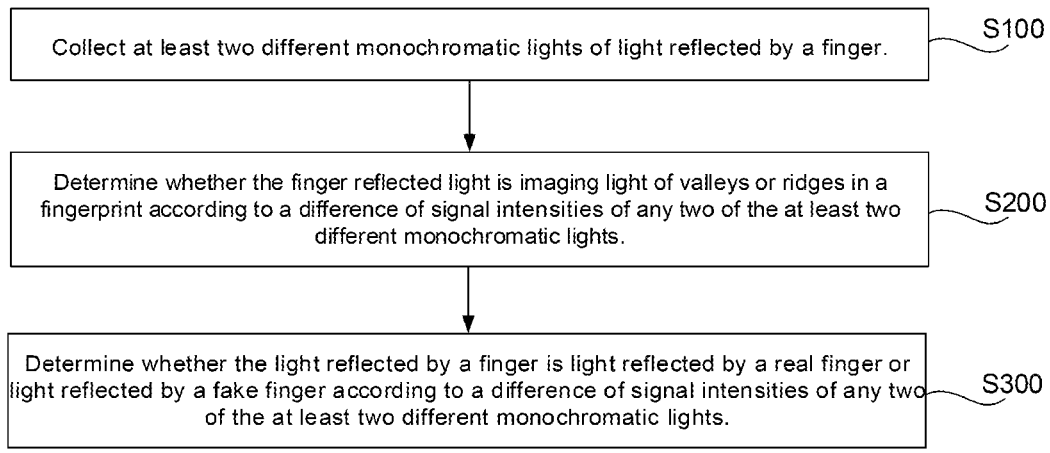
FIG. 22 is a schematic flow chart of yet another fingerprint identification method, according to some embodiments of the present disclosure.

In yet some other embodiments, referring to FIG. 22, the fingerprint identification method further includes S300.

In S300, it is determined whether the light reflected by a finger is the light reflected by a real finger or the light reflected by a fake finger according to the difference between signal intensities of any two of the at least two different monochromatic lights.

The fingerprint identification method provided by some embodiments of the present disclosure is based on the optical characteristics of human skin. As a result, compared with the fingerprint sleeve made of materials such as silica gel and the like, the finger has the characteristic of selectively absorbing light incident to the finger, and reflected light formed through being reflected by the finger and reflected light formed through being reflected by the fingerprint sleeve have significantly different spectrums. For example, if the light reflected by a finger is the light reflected by ridges, the difference between signal intensities of the red light and the green light will be zero or proximate to zero, but the difference between signal intensities of the red light and the green light in the light reflected by ridges formed through being reflected by the fingerprint sleeve is relatively great. That is, there is a significant difference therebetween. Therefore, in the process of identifying the fingerprint, on a basis of the reasonably set threshold value, after a corresponding threshold value and the difference between the signal intensities of the two monochromatic lights in the light reflected by a finger are compared, it may be determined whether the light reflected by a finger is the light reflected by the real finger (i.e., light directly reflected by the user's finger) or the light reflected by the fake finger (i.e., light reflected by the object having the imitated fingerprint, such as the fingerprint sleeve), so that potential security risks in the process of identifying the fingerprint are reduced, and the security during the use of the fingerprint identification sensor and the application equipment thereof is effectively improved.

After the light reflected by a finger is collected, spectrums of light reflected by valleys and light reflected by ridges in the light reflected by a finger may be determined by performing an accurate spectral analysis on the light reflected by a finger. The first threshold value is selectively set according to actual needs, and may be reasonably determined according to a range of signal intensities of the light reflected by valleys and the light reflected by ridges, which is not limited in some embodiments of the present disclosure.

In the description of the above embodiments, specific features, structures, materials or characteristics may be combined in any suitable manner in any one or more embodiments or examples.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A fingerprint identification sensor, comprising:
   a base;
   at least one light sensing unit disposed on the base, the at least one light sensing unit being configured to collect at least two different monochromatic lights of light reflected by a finger to identify a fingerprint, wherein the at least one light sensing unit includes a plurality of light sensing units that are arranged in an array, each of the at least one light sensing unit includes at least two light sensing sub-units, the at least two light sensing sub-units are capable of collecting the at least two different monochromatic lights in a one-to-one correspondence manner, and each of the at least two light sensing sub-units includes a photosensitive diode and a thin film transistor electrically connected to the photosensitive diode;
   a plurality of gate lines;
   a plurality of data lines;
   a gate driver circuit;
   a gate of a thin film transistor of each light sensing sub-unit in each row of light sensing sub-units being electrically connected to the gate driver circuit through a gate line; and
   a data processing circuit a first electrode of a thin film transistor of each light sensing sub-unit in each column of light sensing sub-units being electrically connected to the data processing circuit through a data line, a second electrode of the thin film transistor being electrically connected to an anode of the photosensitive diode, a cathode of the photosensitive diode being electrically connected to a power supply voltage terminal, and the second electrode of the thin film transistor being not electrically connected to the cathode of the photosensitive diode,
   wherein the data processing circuit is configured to receive electric signals representing the at least two different monochromatic lights output by the at least two light sensing sub-units to the data processing circuit through corresponding data lines for data-processing, determine whether the light reflected by the finger is imaging light of valleys in the fingerprint or imaging light of ridges in the fingerprint according to a difference between signal intensities of any two of the at least two different monochromatic lights, so as to complete identification of the fingerprint.

2. The fingerprint identification sensor according to claim 1, further comprising at least one point light source disposed on the base; the at least one point light source being configured to provide the finger with polychromatic light that is a composition of the at least two monochromatic lights of different wavelengths.

3. The fingerprint identification sensor according to claim 1, wherein each of the at least two light sensing sub-units further includes:
   a filter portion disposed on a light incident side of the photosensitive diode,
   wherein optical signals allowed to be transmitted by filter portions of different light sensing sub-units in a same light sensing unit are of different wavelength ranges.

4. The fingerprint identification sensor according to claim 3, wherein the filter portion includes a color resist layer; and color resist layers of different light sensing sub-units in a same light sensing unit have different colors.

5. The fingerprint identification sensor according to claim 4, wherein the colors of the color resist layers of the different light sensing sub-units in the same light sensing unit include at least red and green.

6. A display substrate, comprising: the fingerprint identification sensor according to claim 1, and a pixel layer disposed on a light incident side of the at least one light sensing unit.

7. The display substrate according to claim 6, wherein the display substrate is an organic light-emitting diode substrate, and the pixel layer includes a plurality of pixels; and
   the fingerprint identification sensor includes at least one point light source, at least one of the pixels is the at least one point light source.

8. A display device, comprising the display substrate according to claim 6.

9. A fingerprint identification method, comprising:
   collecting at least two different monochromatic lights of light reflected by a finger; and
   determining whether the light reflected by a finger is imaging light of valleys in a fingerprint or imaging light of ridges in the fingerprint according to a difference between signal intensities of any two of the at least two different monochromatic lights.

10. The fingerprint identification method according to claim 9, wherein determining whether the light reflected by a finger is the imaging light of the valleys in the fingerprint or the imaging light of the ridges in the fingerprint according to the difference between the signal intensities of any two of the at least two different monochromatic lights, includes:
    determining whether an absolute value of the difference is less than a first threshold value;
    if yes, determining that the light reflected by a finger is the imaging light of the ridges in the fingerprint; and
    if no, determining that the light reflected by a finger is the imaging light of the valleys in the fingerprint.

11. The fingerprint identification method according to claim 9, further comprising:
    acquiring light intensity of the light reflected by a finger when the at least two different monochromatic lights are collected, wherein
    determining whether the light reflected by a finger is the imaging light of the valleys in the fingerprint or the imaging light of the ridges in the fingerprint according to the difference of the signal intensities of any two of the at least two different monochromatic lights, further includes:
    determining whether the light reflected by a finger is the imaging light of the valleys in the fingerprint or the imaging light of the ridges in the fingerprint according to the difference between the signal intensities of any two of the at least two different monochromatic lights and the light intensity of the light reflected by a finger.

12. The fingerprint identification method according to claim 9, further comprising:

determining whether the light reflected by a finger is light reflected by a real finger or light reflected by a fake finger according to the difference between the signal intensities of any two of the at least two different monochromatic lights.

13. The fingerprint identification sensor according to claim 1, wherein the at least one light sensing unit is configured to collect at least green light and red light of light reflected by a finger.

14. The fingerprint identification sensor according to claim 3, wherein the at least one light sensing unit is further configured to collect blue light of light reflected by a finger.

15. The fingerprint identification sensor according to claim 5, wherein the colors of the color resist layers of the different light sensing sub-units in the same light sensing unit further include blue.

16. The fingerprint identification method according to claim 9, wherein determining whether the light reflected by a finger is the imaging light of the valleys in the fingerprint or the imaging light of the ridges in the fingerprint according to the difference between the signal intensities of any two of the at least two different monochromatic lights, includes:
  determining whether an absolute value of the difference is less than a second threshold value or greater than a third threshold value;
  if the absolute value of the difference is less than the second threshold value, determining that the light reflected by a finger is the imaging light of the ridges in the fingerprint; and
  if the absolute value of the difference is greater than the third threshold value, determining that the light reflected by a finger is the imaging light of the valleys in the fingerprint,
  wherein the second threshold value is less than the third threshold value.

* * * * *